US009397215B1

(12) United States Patent
Cheng et al.

(10) Patent No.: US 9,397,215 B1
(45) Date of Patent: Jul. 19, 2016

(54) FINFET WITH REDUCED SOURCE AND DRAIN RESISTANCE (71) Applicant: International Business Machines Corporation, Armonk, NY (US)

(72) Inventors: Kangguo Cheng, Schenectady, NY (US); Juntao Li, Cohoes, NY (US); Xin Miao, Guilderland, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/845,390

(22) Filed: Sep. 4, 2015

(51) Int. Cl.
| H01L 29/76 | (2006.01) |
| H01L 29/78 | (2006.01) |
| H01L 29/66 | (2006.01) |
| H01L 21/306 | (2006.01) |
| H01L 21/308 | (2006.01) |
| H01L 21/02 | (2006.01) |
| H01L 21/762 | (2006.01) |
| H01L 21/311 | (2006.01) |
| H01L 21/324 | (2006.01) |
| H01L 29/161 | (2006.01) |
| H01L 29/06 | (2006.01) |

(52) U.S. Cl.
CPC ...... *H01L 29/7848* (2013.01); *H01L 21/02532* (2013.01); *H01L 21/3085* (2013.01); *H01L 21/30604* (2013.01); *H01L 21/31111* (2013.01); *H01L 21/324* (2013.01); *H01L 21/76224* (2013.01); *H01L 29/0692* (2013.01); *H01L 29/161* (2013.01); *H01L 29/66795* (2013.01); *H01L 29/7851* (2013.01)

(58) Field of Classification Search
CPC ............. H01L 29/7848; H01L 29/161; H01L 21/3085; H01L 21/76224; H01L 21/30604; H01L 29/7851; H01L 21/324; H01L 29/0692; H01L 29/66795; H01L 21/31111; H01L 21/02532
See application file for complete search history.

(56) References Cited

U.S. PATENT DOCUMENTS

| 8,367,528 | B2 * | 2/2013 | Bauer | ............... | H01L 21/02381 257/E21.131 |
| 8,435,846 | B2 | 5/2013 | Cheng et al. | | |
| 8,946,009 | B2 | 2/2015 | Basu et al. | | |
| 8,962,369 | B2 | 2/2015 | Loo et al. | | |
| 8,994,072 | B2 | 3/2015 | Kerber et al. | | |

(Continued)

OTHER PUBLICATIONS

IP.com; "A Struture for Forming a Contact with Improved Contact Resistance and Overlay Tolerance";IP.com No. 000226568; p. 1-5; Apr. 16, 2013.
IP.com; "Segmented Stacked FinFET for Improved Contact Resistance"; IP.com No. 000242086; p. 1-2; Jun. 18, 2015.

(Continued)

*Primary Examiner* — Jarrett Stark
(74) *Attorney, Agent, or Firm* — Cantor Colburn LLP; Vazken Alexanian (57) ABSTRACT

A method for forming a semiconductor device comprises patterning and etching a fin in a semiconductor substrate, forming a gate stack over the fin, epitaxially growing a first semiconductor material on exposed portions of the fin, epitaxially growing a second semiconductor material on exposed portions of the first semiconductor material, and performing an etching process that removes exposed portions of the first semiconductor material and exposed portions of the second semiconductor material, the etching process is operative to remove portions of the first semiconductor material at a faster rate than the second semiconductor material such that a first cavity is formed adjacent to the fin.

2 Claims, 14 Drawing Sheets

(56) References Cited

U.S. PATENT DOCUMENTS

| | | | |
|---|---|---|---|
| 8,999,779 B2 | 4/2015 | Naczas et al. | |
| 9,053,934 B2 | 6/2015 | Chao et al. | |
| 9,054,189 B1 | 6/2015 | Kim et al. | |
| 9,224,736 B1* | 12/2015 | Ching | H01L 27/0924 |
| 2008/0206934 A1* | 8/2008 | Jones | H01L 21/84 |
| | | | 438/151 |
| 2012/0276695 A1 | 11/2012 | Cheng et al. | |
| 2014/0264590 A1* | 9/2014 | Yu | H01L 29/66795 |
| | | | 257/344 |
| 2014/0322882 A1 | 10/2014 | Rodder et al. | |
| 2014/0363935 A1 | 12/2014 | Fu et al. | |
| 2015/0017776 A1 | 1/2015 | Tsai et al. | |
| 2015/0035023 A1* | 2/2015 | Kim | H01L 29/785 |
| | | | 257/288 |
| 2015/0303118 A1* | 10/2015 | Wang | H01L 21/823481 |
| | | | 257/401 |
| 2016/0005863 A1* | 1/2016 | Kuang | H01L 29/7848 |
| | | | 257/190 |

OTHER PUBLICATIONS

IP.com; "SOI Fin/FET Ge I/I for Contact Resistance Reduction"; IP.com No. 000211612; p. 1-7; Oct. 13, 2011.

Kangguo Cheng, et al.,"FinFET With Reduced Source and Drain Resistance", U.S. Appl. No. 14/967,732, filed Dec. 14, 2015.

List of IBM Patent Applications Treated as Related; Date Filed: Sep. 4, 2015, p. 1-2.

* cited by examiner

FINFET WITH REDUCED SOURCE AND DRAIN RESISTANCE

BACKGROUND

The present invention relates to field effect transistors (FETs), and more specifically, to FinFET devices.

The present invention generally relates to metal-oxide-semiconductor field-effect transistors (MOSFET), and more specifically, to MOSFET interconnect technology.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

SUMMARY

According to an exemplary embodiment of the present invention, a method for forming a semiconductor device comprises patterning and etching a fin in a semiconductor substrate, forming a gate stack over the fin, epitaxially growing a first semiconductor material on exposed portions of the fin, epitaxially growing a second semiconductor material on exposed portions of the first semiconductor material, and performing an etching process that removes exposed portions of the first semiconductor material and exposed portions of the second semiconductor material, the etching process is operative to remove portions of the first semiconductor material at a faster rate than the second semiconductor material such that a first cavity is formed adjacent to the fin.

According to another exemplary embodiment of the present invention, a method for forming a semiconductor device comprises patterning and etching a fin in a semiconductor substrate, forming a gate stack over the fin, epitaxially growing a first semiconductor material comprising silicon germanium having a concentration of germanium of about 50% to 100% on exposed portions of the fin, epitaxially growing a second semiconductor material comprising silicon germanium having a concentration of germanium of about 0% to 40% on exposed portions of the first semiconductor material, performing an etching process that removes exposed portions of the first semiconductor material and exposed portions of the second semiconductor material, the etching process is operative to remove portions of the first semiconductor material at a faster rate than the second semiconductor material such that a first cavity is formed adjacent to the fin, depositing an insulating material layer in the cavity, over the fin, the first semiconductor material and the second semiconductor material, removing a portion of the insulating material layer to form a second cavity that exposes a portion of the fin, the first cavity, the first semiconductor material, and the second semiconductor material, and depositing a conductive material in the second cavity.

According to yet another exemplary embodiment of the present invention, a semiconductor device comprises a first semiconductor fin arranged on a substrate, a first layer of semiconductor material arranged on sidewalls of the first semiconductor fin, a second layer of semiconductor material arranged on the first layer of semiconductor material, a cavity formed adjacent to the fin partially defined by the first layer of semiconductor material, the second layer of semiconductor material, and the first semiconductor fin, a conductive material arranged in the cavity, the conductive material partially defining an interface between the conductive material, the first fin, the first semiconductor material, and the second semiconductor material, the interface having a non-planar profile.

DETAILED DESCRIPTION

To reduce the scaling of FinFET devices, the FinFET fins are fabricated with a greater fin height and a reduced fin pitch, which increases the source and drain region (active region) contact resistance. Such an increase in contact resistance in the active regions reduces the efficiency and degrades the overall performance of FinFET devices.

The methods and devices described herein provide a FinFET device with relatively large fin height and small fin pitch and decreased active region resistance, which improves the performance of FinFET devices.

Figure 1:
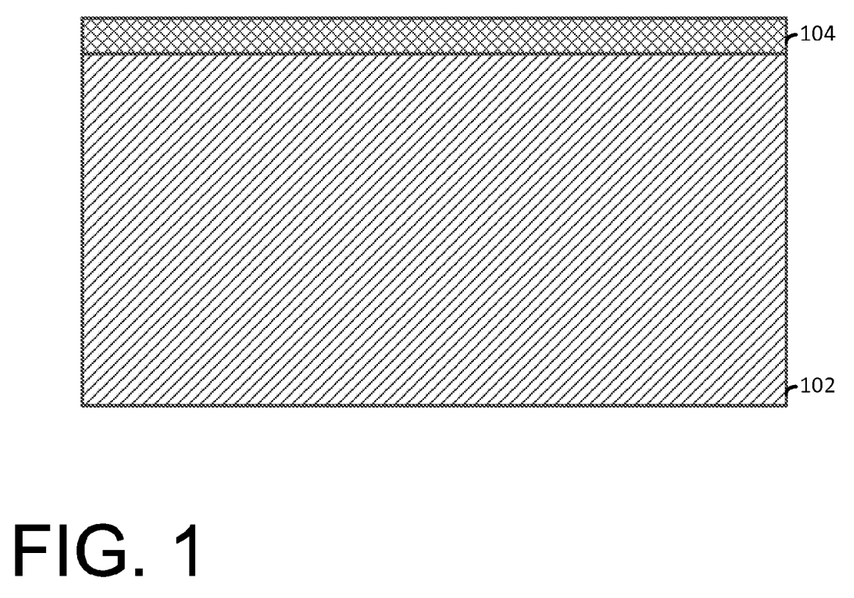
FIG. 1 illustrates side view of a semiconductor substrate.

In this regard, FIG. 1 illustrates side view of a semiconductor substrate 102 and a hardmask layer 104 arranged on the substrate 102. In the illustrated embodiment, the substrate 102 includes silicon material. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Other examples of suitable substrates include semiconductor-on-insulator (SOI) substrates with buried oxide (BOX) layers. The thickness of the substrate is not intended to be limited.

An SOI wafer includes a thin layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Non-limiting examples of suitable materials for the hard mask layer 104 include silicon oxide, silicon nitride, or any combination thereof. The thickness of the hard mask layer 104 is not intended to be limited.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 2:
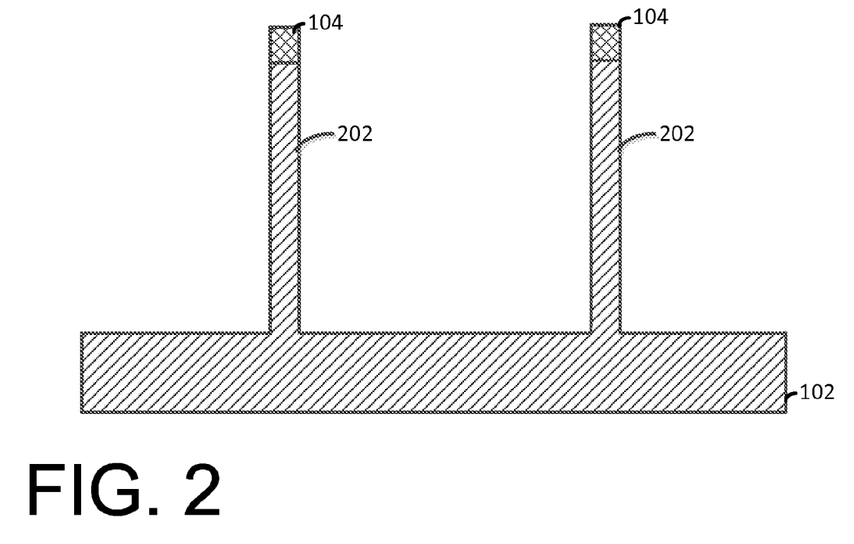
FIG. 2 illustrates the resultant structure following the formation of fins.

FIG. 2 illustrates the resultant structure following the formation of fins 202 in the semiconductor substrate 102. The fins 202 are formed by, for example, a lithographic patterning and etching process such as, reactive ion etching (RIE). Other suitable techniques for forming fins include sidewall imaging transfer (SIT), self-aligned double patterning (SADP), self-aligned quadruple patterning (SAQP).

Figure 3:
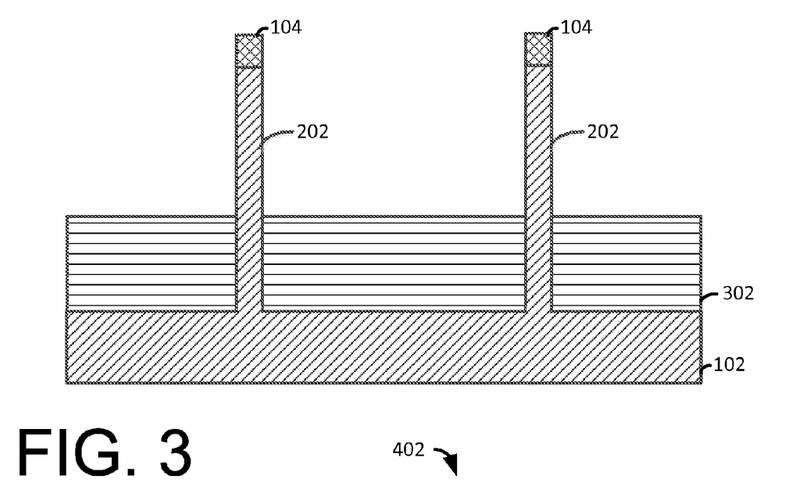
FIG. 3 illustrates the formation of silicon trench isolation (STI) regions.

FIG. 3 illustrates the formation of silicon trench isolation (STI) regions 302 between the fins. The STI regions 302 are isolation regions formed by etching trenches in the substrate and then filling the trenches with, for example, silicon oxide ($SiO_2$). Alternatively, the trenches may be lined with a silicon dioxide liner formed by a thermal oxidation process and then filled with additional silicon dioxide or another material.

A dielectric material is deposited around the fins to form the STI regions 302. Non-limiting examples of suitable dielectric materials for the STI regions 302 include silicon dioxide, silicon nitride, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof. In addition to STI isolation, the FinFET may further comprises junction isolation (e.g., a doped region below fin channel to electrically suppress the leakage current between source and drain. In SOI FinFET, STI and junction isolation can be omitted due to the isolation of the buried oxide below SOI layer.

Figure 4:
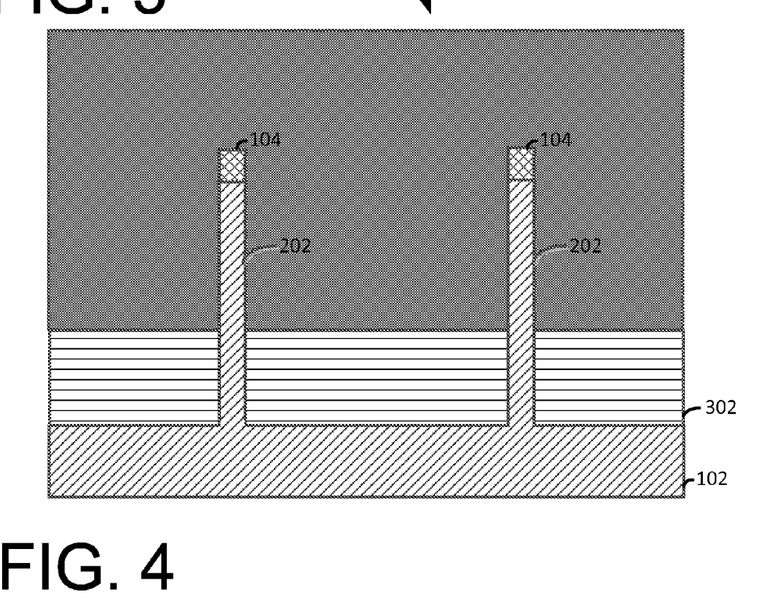
FIG. 4 illustrates a side view along the line A-A of FIG. 5 of the resultant structure following the formation of a gate stack.

FIG. 4 illustrates a side view along the line A-A (of FIG. 5) of the resultant structure following the formation of a gate stack 402. The gate stack 402 can include a sacrificial gate stack (dummy gate) or a real gate. If the gate stack 402 is a dummy gate, it will be replaced by high-k gate dielectric/metal gate in subsequent processes. For an embodiment that includes a dummy gate, the dummy gate may include a dummy gate dielectric (e.g., silicon oxide, silicon oxynitride) and a dummy gate (e.g., polycrystalline silicon or amorphous silicon). In alternate embodiments where the gate stack 402 includes an actual gate, the gate stack 402 includes high-k metal gates formed, for example, by filling a dummy gate opening (not shown) with one or more high-k dielectric materials, one or more workfunction metals, and one or more metal gate conductor materials.

The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

Figure 5:
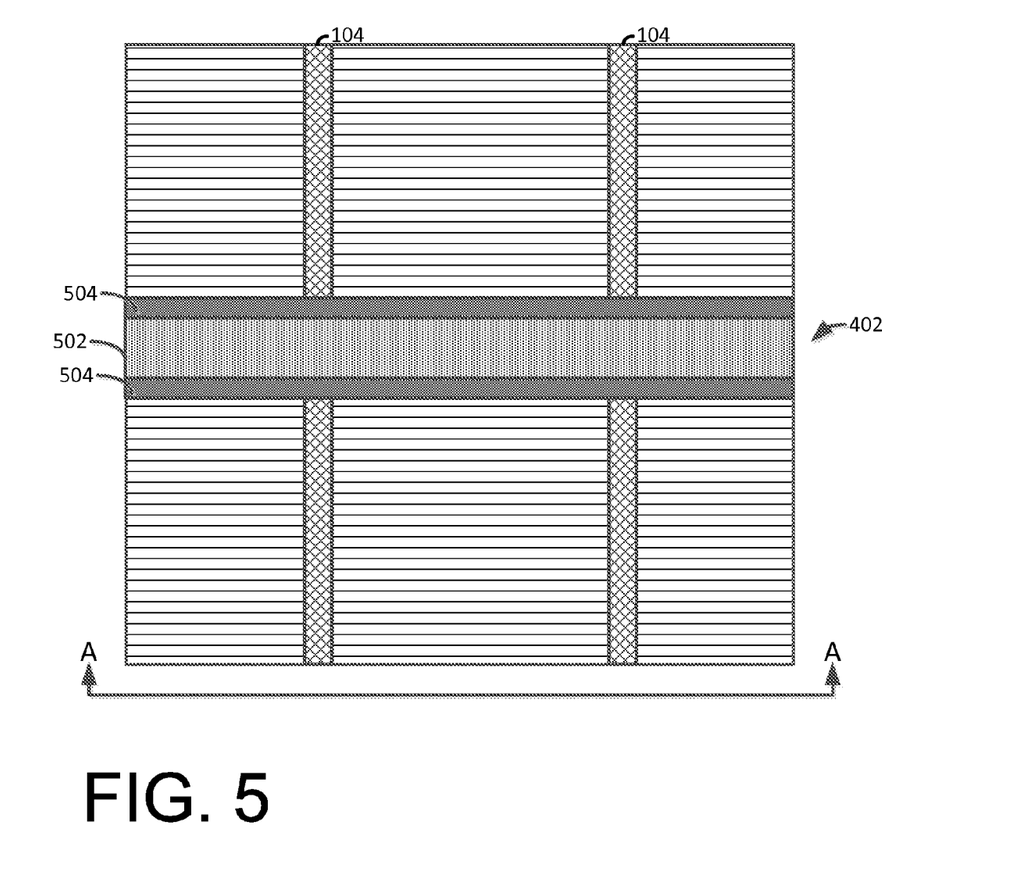
FIG. 5 illustrates a top view of the resultant structure following the formation of the gate stack.

FIG. 5 illustrates a top view of the resultant structure following the formation of the gate stack 402. The gate stack 402 includes a capping layer 502. Spacers 504 are arranged adjacent to the gate stack 402. Non-limiting examples of suitable materials for the spacers 220 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). Following the deposition process, the spacer material is etched by, for example, an RIE process.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the type of FET device. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hathium, zirconium, titanium, tantalum, aluminum, metal carbides (e.g., hafnium carbide, zirconium carbide, titanium carbide, and aluminum carbide), aluminides, or any combination thereof.

Figure 6:
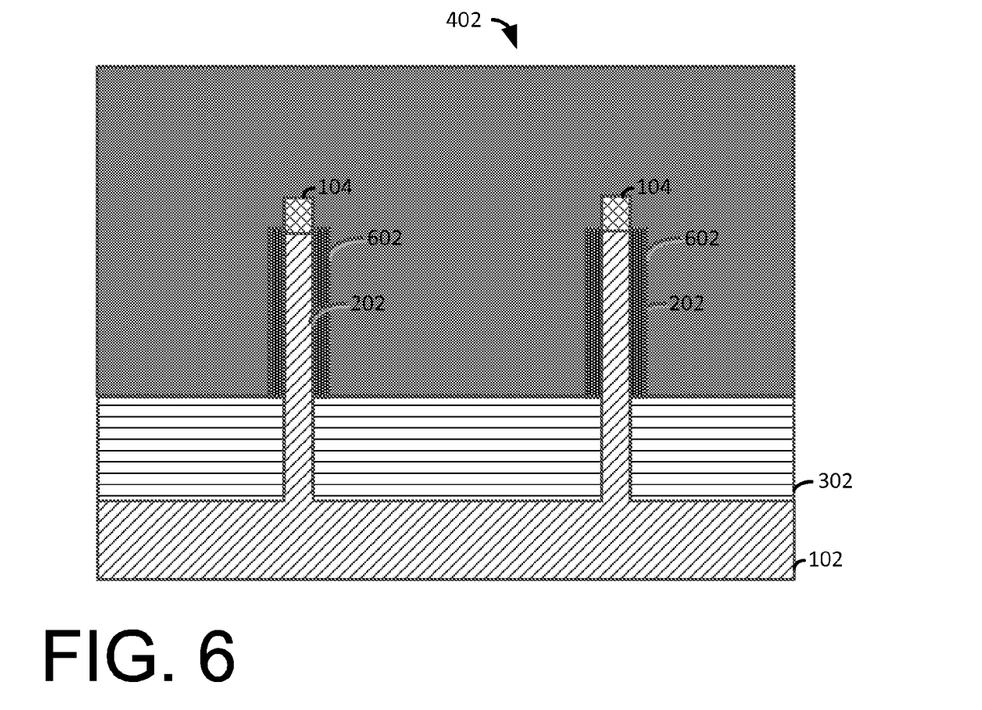
FIG. 6 illustrates the resultant structure following an epitaxial growth process.

FIG. 6 illustrates the resultant structure following an epitaxial growth process that grows a layer of semiconductor material 602 such as, for example, silicon germanium on exposed surfaces of the fins 202. The layer of semiconductor material 602 in the illustrated embodiment is about 5 nanometers thick and includes a relatively high concentration of germanium. In some embodiments, the layer of semiconductor material 602 may include a dopant such as, for example, boron or indium with a concentration of about 2e20 to 1e21 per $cm^3$ with a concentration of Ge of about 50% to 100%. In some embodiments, the layer of semiconductor material 602 can be doped with phosphorus or arsenic (for nFET), with a dopant concentration of about 2e20 to 1e21 per $cm^3$. In yet other embodiments, the epitaxy material is undoped during epitaxy process. Dopants are added to the epitaxy material grown in a subsequent epitaxial growth process (described below) by a process such as, for example, ion implant or plasma doping.

Figure 7:
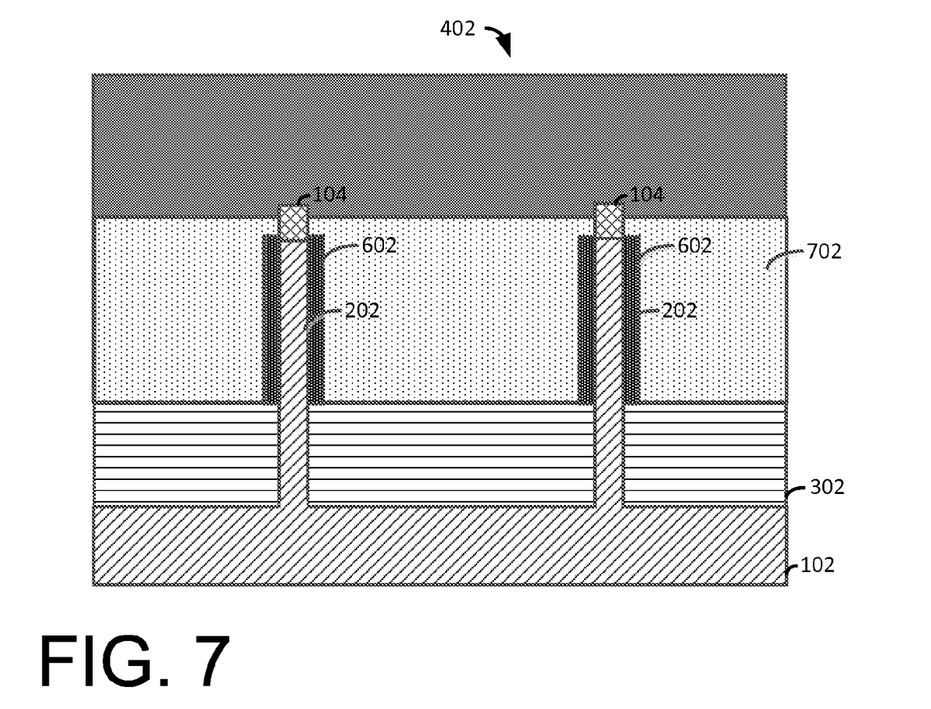
FIG. 7 illustrates a side view of the resultant structure following a second epitaxial growth of semiconductor material.
Figure 8:
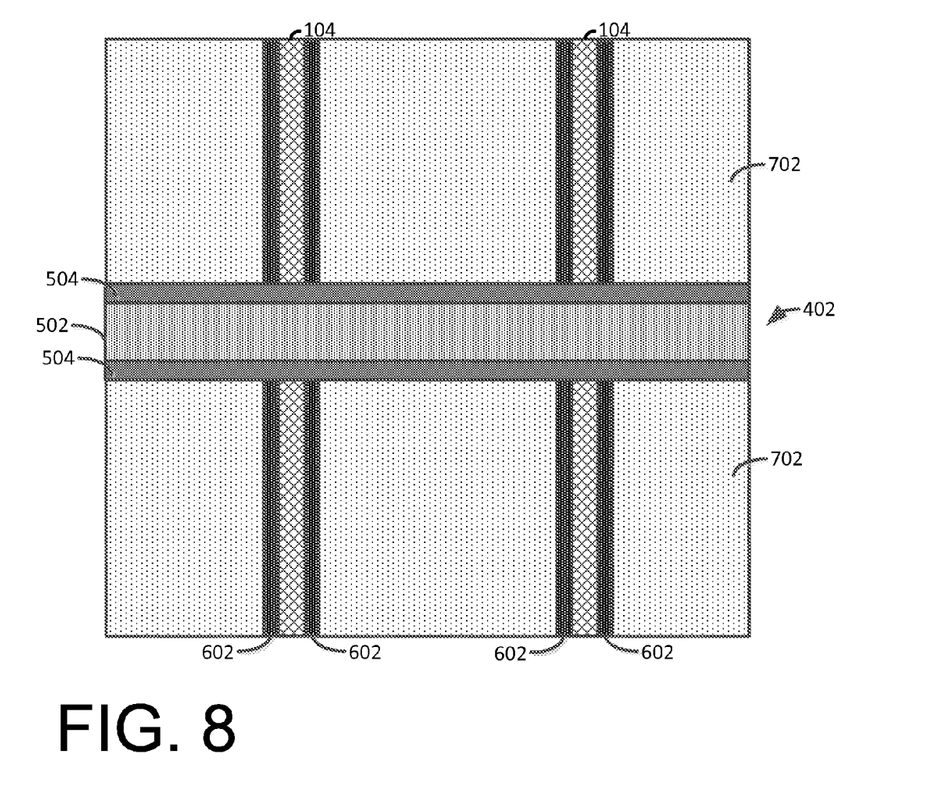
FIG. 8 illustrates a top view of the resultant structure following a second epitaxial growth of semiconductor material.

FIG. 7 illustrates a side view and FIG. 8 illustrates a top view of the resultant structure following a second epitaxial growth of semiconductor material. In this regard, the second semiconductor material 702 is seeded from exposed portions of the layer of semiconductor material 602. The second semiconductor material 702 of the illustrated embodiment includes silicon germanium with a lower concentration of germanium. The second semiconductor material 702 includes a concentration of Ge from about 0% to 40%. The second semiconductor material 702 may include a dopant such as, for example boron, indium, phosphorus or arsenic. The dopants may be added in-situ during the epitaxial growth process, or implanted following the epitaxial growth process by a suitable process such as, for example, ion implantation or plasma doping.

As discussed above, the layer of semiconductor material 604 may have a concentration of Ge from about 50% to 100%, with the remainder of the material including silicon or another semiconductor material. The second semiconductor material 702 has a concentration of Ge from about 0% to 40%, with the remainder of the material including silicon or another semiconductor material.

Often, epitaxially growing SiGe with high concentrations of Ge results in an epitaxially grown material having many defects when the epitaxy thickness exceeds a "threshold thickness," which reduces the strain benefits in the material. Thus, the growth of the relatively thin semiconductor layer 602 having a high concentration of germanium followed by the growth of the second semiconductor material 702 having a relatively lower concentration of germanium provides active regions that have a tolerable amount of defects, while increasing the Ge in the active region.

Figure 9:
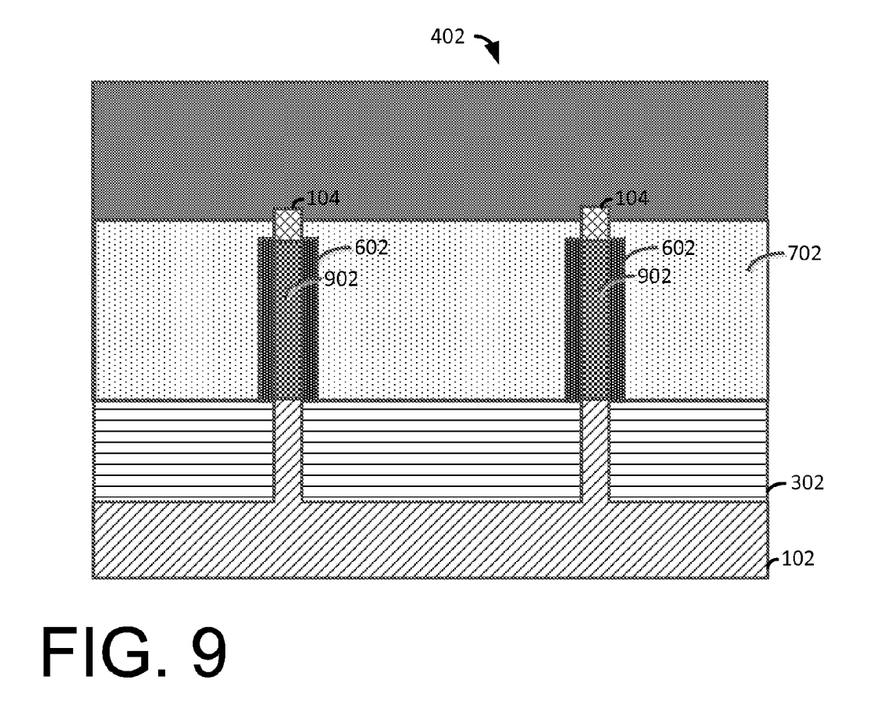
FIG. 9 illustrates a side view of the structure following an annealing process.

FIG. 9 illustrates a side view of the structure following an annealing process that drives dopants from the semiconductor layer 602 into the fins 202 (of FIG. 7) to result in doped fins 902. The doped fins 902 provide a doped extension of the active regions partially defined by the second semiconductor material 702. Forming a doped extension of the active regions may be performed in alternate embodiments by, for example, ion implantation or plasma doping prior to epitaxially growing the semiconductor layer 602 or ion implantation or plasma doping following the epitaxial growth processes described above.

Figure 10:
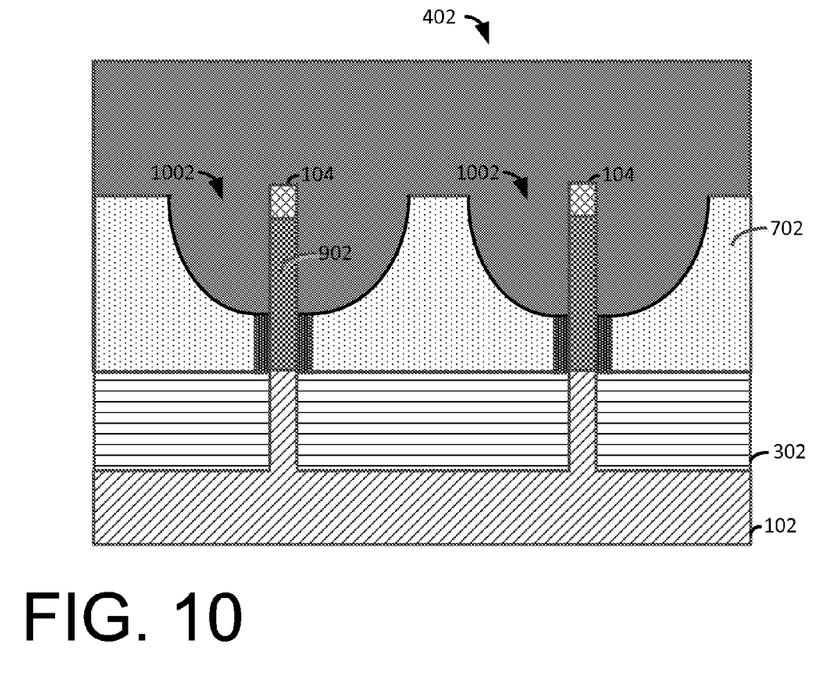
FIG. 10 illustrates the formation of cavities.

FIG. 10 illustrates the formation of cavities 1002 that are partially defined by the second semiconductor material 702, the doped fins 902, the layer of semiconductor material 602, and the gate stack 402. The cavities 1002 are formed by an etching process such as, for example, a wet etching process using a solution with deionized water, aqueous $NH_4OH$ (ammonium hydroxide) and aqueous $H_2O_2$ (hydrogen peroxide. The etch temperature ranges from 15 degrees to 80 degrees Celsius. Alternatively the selective etch can be done with gas phase HCl (hydrofluoric acid) at temperature ranging from 450 degrees to 800 degrees Celsius.

Figure 11:
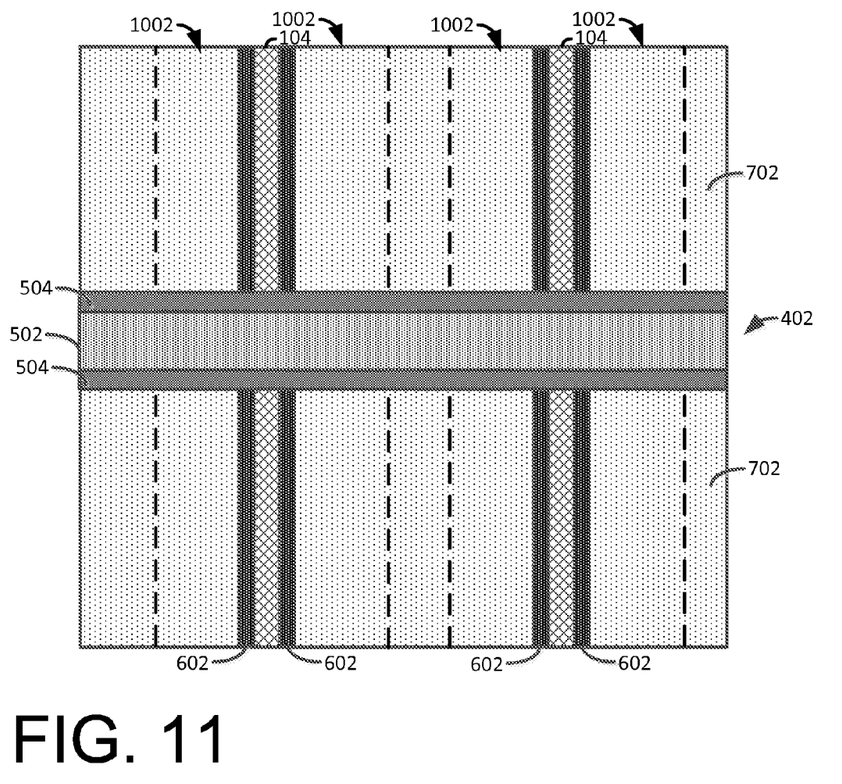
FIG. 11 illustrates a top view of structure that includes the cavities.

The etching process that forms the cavities 1002 is operative to etch SiGe with a relatively high percentage of Ge at a faster rate than SiGe having a lower percentage of Ge. Thus, the layer of semiconductor material 602 is etched at a faster rate than the semiconductor material 702, which results in the cavities 1002. FIG. 11 illustrates a top view of the exemplary structure that includes the cavities 1002 described above in FIG. 10.

Figure 12:
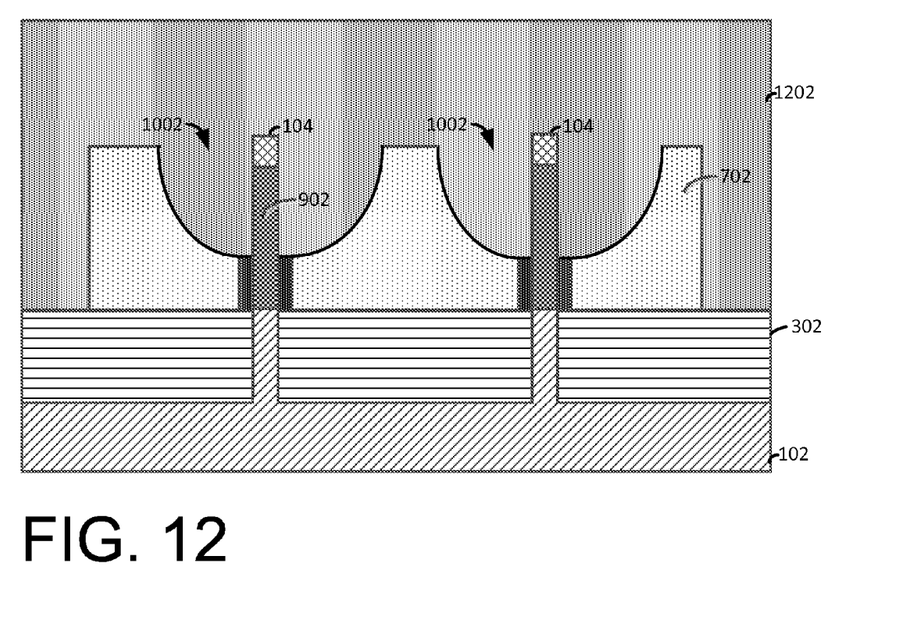
FIG. 12 illustrates the resultant structure following the formation of a dielectric material layer.

FIG. 12 illustrates the resultant structure following the formation of a dielectric material layer 1202. The dielectric layer 1202 may be formed from, for example, an insulating material, a low-k dielectric oxide, including but not limited to, silicon dioxide, spin-on-glass, a flowable oxide, a high density plasma oxide, borophosphosilicate glass (BPSG), or any combination thereof.

The low-k dielectric oxide layer 1202 is deposited by a suitable deposition process, including, but not limited to CVD, PVD, plasma enhanced CVD, atomic layer deposition (ALD), evaporation, chemical solution deposition, or like processes. The dielectric layer 1202 may further comprise a liner (e.g., silicon nitride) (not shown) that is deposited before the oxide.

Figure 13:
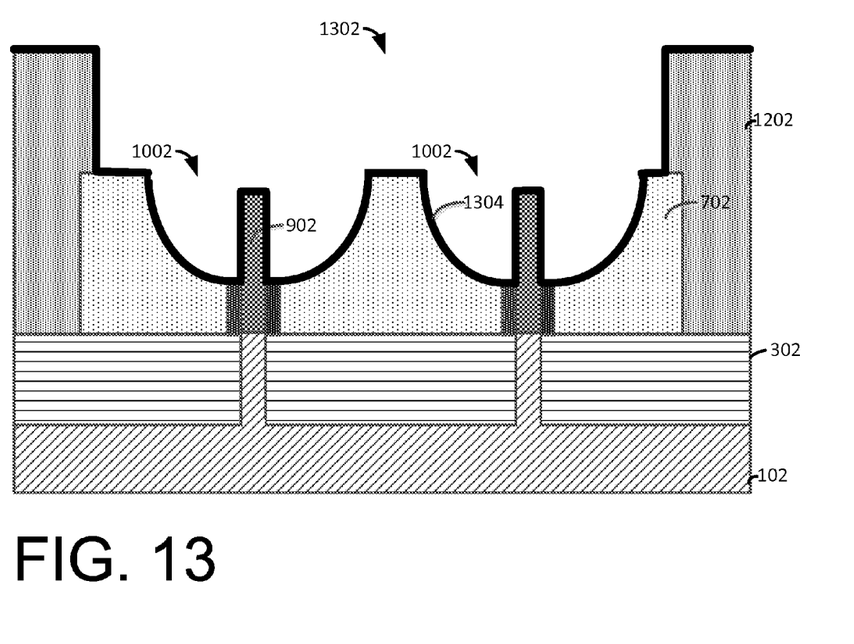
FIG. 13 illustrates a cross sectional view following the formation of a cavity.

FIG. 13 illustrates a cross sectional view following the formation of a cavity 1302. The cavity 1302 is formed following a suitable patterning and etching process that removes exposed portions of the dielectric layer 1202 to expose portions of the semiconductor material 702, the dopes fins 902, and the layer of semiconductor material 602. Following the formation of the cavity 1302, a liner layer 1304 may be deposited in the cavity 1302. The liner layer 1304 may include cobalt, titanium, cobalt titanium, nickel, platinum, nickel platinum titanium, or any combination thereof. The one or more layers or films making up the liner 221 may be formed by a chemical vapor deposition process (CVD) or atomic layer deposition (ALD). The purpose of the liner is to react with the underlying semiconductor to form an interfacial silicide to reduce the contact resistivity, and to serve as an adhesion layer for the subsequent deposition of the conducting material 1402 in case the adheres ion layer is needed for 1402 deposition (described below).

Figure 14:
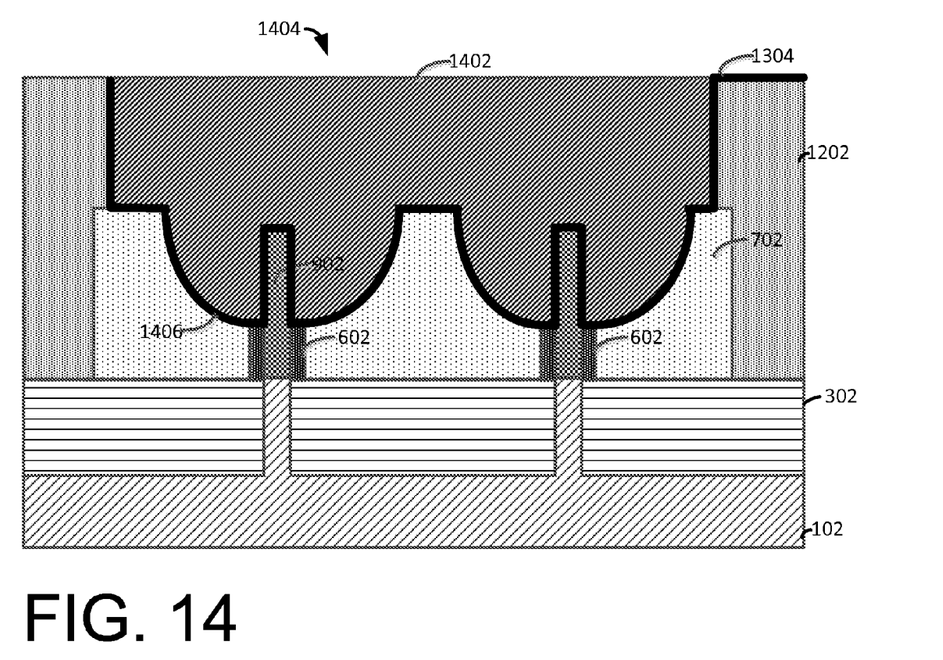
FIG. 14 illustrates a cross sectional view along the line B-B of FIG. 15 of the resultant structure following the deposition of a conductive material.

FIG. 14 illustrates a cross sectional view along the line B-B (of FIG. 15) of the resultant structure following the deposition of a conductive material 1402 in the cavity 1302 (of FIG. 13) over the liner layer 1304. The conductive material 1402 may include any suitable material including, for example, aluminum, silver, gold, copper tungsten or other conductive materials. In the illustrated embodiment, the conductive material 1402 is disposed in the cavity and on the dielectric layer 1202. A planarization process such as, for example, chemical mechanical polishing (CMP) may be performed to remove overburden portions of the conductive material 1402 and define a conductive contact 1404.

Figure 15:
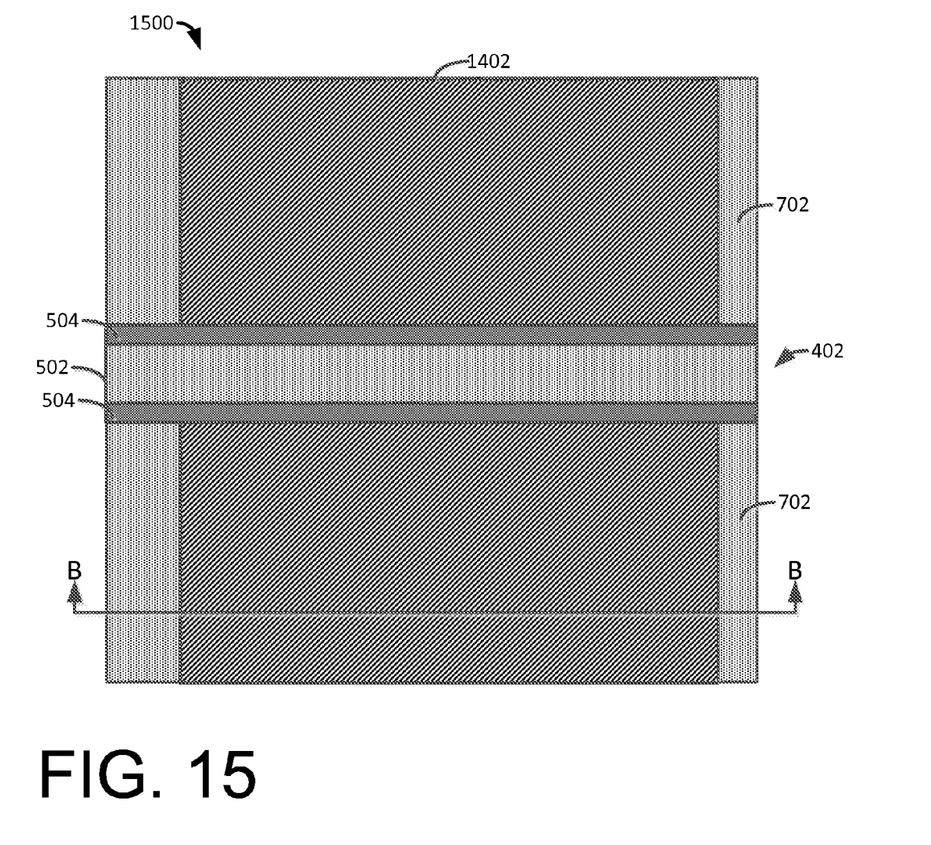
FIG. 15 illustrates a top view of a FinFET device.

In this regard, the conductive contact 1404 has a cross section at an interface 1406 with the doped fins 902, the semiconductor layer 602, and the second semiconductor material 702 that generally follows the liner layer 1304. FIG. 15 illustrates a top view of a FinFET device 1500.

Figure 16:
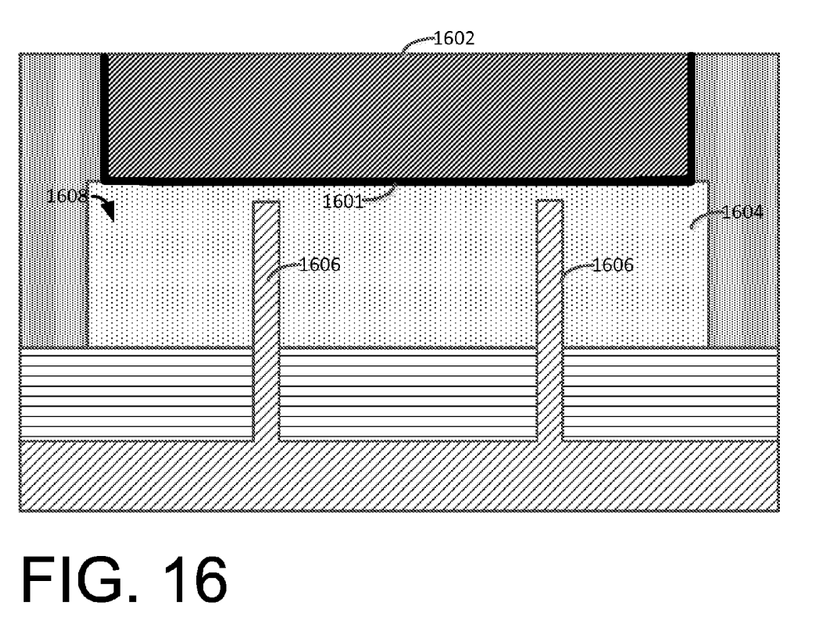
FIG. 16 illustrates a cross sectional view of an example of a traditional interface between a conductive contact and an epitaxially grown semiconductor material.

FIG. 16 illustrates a cross sectional view of an example of a traditional interface 1601 between a conductive contact 1602 and an epitaxially grown semiconductor material 1604 that was seeded by the fins 1606; collectively the semiconductor material 1604 and the fins 1606 define active regions 1608 of the FinFET device. The interface 1601 between the conductive contact 1602 and the active region 1608 is substantially planar and has a resistance that corresponds to the surface area of the interface 1601.

Referring back to FIG. 14, the interface 1406 has an undulating non-planar profile that results in a greater surface area than the surface area of the interface 1602 (of FIG. 16). The greater surface area of the exemplary embodiment shown in FIG. 14 offers lower resistance than the example interface 1602 shown in FIG. 16. Lowering the resistance of the interface between the conductive contact 1602 and the active regions 1608 reduces the external resistance of the FinFET device, thereby increasing the overall performance of such a FinFET in a system.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a first semiconductor fin arranged on a substrate;
a first layer of semiconductor material arranged on sidewalls of the first semiconductor fin;
a second layer of semiconductor material arranged on the first layer of semiconductor material;
a cavity formed adjacent to the fin partially defined by the first layer of semiconductor material, the second layer of semiconductor material, and the first semiconductor fin; and
a conductive material arranged in the cavity, the conductive material partially defining an interface between the conductive material, the first fin, the first semiconductor material, and the second semiconductor material, the interface having a non-planar profile, wherein the conductive material contacts the first semiconductor material and the second semiconductor material.

2. A semiconductor device comprising:
a first semiconductor fin arranged on a substrate;
a first layer of semiconductor material arranged on sidewalls of the first semiconductor fin;
a second layer of semiconductor material arranged on the first layer of semiconductor material;
a cavity formed adjacent to the fin partially defined by the first layer of semiconductor material, the second layer of semiconductor material, and the first semiconductor fin;
a liner layer disposed in the cavity, wherein the liner layer contacts the first semiconductor material and the second semiconductor material; and
a conductive material arranged on the liner layer in the cavity, the conductive material partially defining an interface between the conductive material, the first fin, the first semiconductor material, and the second semiconductor material, the interface having a non-planar profile.

* * * * *